(12) United States Patent
Watanabe et al.

(10) Patent No.: US 6,664,876 B2
(45) Date of Patent: Dec. 16, 2003

(54) SUPERCONDUCTING MAGNET AND MAGNETIC RESONANCE IMAGING APPARATUS USING THE SAME

(75) Inventors: Hiroyuki Watanabe, Hitachi (JP); Tsutomu Yamamoto, Hitachi (JP); Yoshihide Wadayama, Hitachiota (JP); Hirotaka Takeshima, Ryuugasaki (JP); Kenji Sakakibara, Kashiwa (JP); Takao Honmei, Hitachinaka (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/170,392

(22) Filed: Jun. 14, 2002

(65) Prior Publication Data
US 2003/0048163 A1 Mar. 13, 2003

(30) Foreign Application Priority Data
Sep. 12, 2001 (JP) ......................................... 2001-275895

(51) Int. Cl.$^7$ ............................... H01F 5/00; F15C 5/02
(52) U.S. Cl. .......................... 335/216; 324/318; 62/51.1
(58) Field of Search .......................... 335/216; 324/318, 324/319, 320; 62/51.1

(56) References Cited

U.S. PATENT DOCUMENTS
6,323,749 B1 * 11/2001 Hsieh .......................... 335/299

FOREIGN PATENT DOCUMENTS
JP 10-179546 7/1998
JP 11-16719 1/1999

* cited by examiner

Primary Examiner—Ramon M. Barrera
(74) Attorney, Agent, or Firm—Mattingly, Stanger & Malur, P.C.

(57) ABSTRACT

Effect of vibration of a refrigerator on a superconducting coil is reduced to reduce disturbance in an image.

A coolant tank for supplying a coolant to coil containers is provided separately from the coil containers, and the refrigerator is placed in the coolant tank, and a coolant circulation passage connects between the coolant tank and the coil containers.

15 Claims, 9 Drawing Sheets

US 6,664,876 B2

SUPERCONDUCTING MAGNET AND MAGNETIC RESONANCE IMAGING APPARATUS USING THE SAME

BACKGROUND OF THE INVENTION

The present invention relates to a superconducting magnet and a magnetic resonance imaging apparatus using the superconducting magnet, and particularly to a super conducting magnet suitable for an open-type MRI apparatus not giving blockfeeling to a person to be inspected and an MRI apparatus using the superconducting magnet.

PRIOR ART

An example of a conventional superconducting magnet used for an MRI apparatus is disclosed in Japanese Patent Application Laid-Open No. 10-179546. The conventional superconducting magnet described in the patent gazette is constructed in such that a coil container containing the superconducting magnet immerged into cooling medium of liquid helium also serves as a helium tank for storing the liquid helium, and a refrigerator for cooling the liquid helium is directly placed in the coil container (the helium container).

Further, a method, in which a flexible portion such as a bellows is placed between a refrigerator and a cryostat portion placing the refrigerator as an accommodation against vibration of the refrigerator, is disclosed in Japanese Patent Application Laid-Open No. 11-16719. Although this method can certainly insulate the vibration between the cryostat and the cold head of the refrigerator, in order to secure the vibration insulation while the cooling performance is being secured, various kinds of such devices as described the above-described patent are necessary and accordingly the cost is increased.

However, the conventional superconductor for the MRI apparatus has the following problems.

That is, since the refrigerator for cooling the liquid helium is directly placed in the coil container, the vibration of the refrigerator is directly transmitted to the coil container, and the superconducting coil contained in the inside is also vibrated by the vibration to vibrate the generated magnetic flux. Since the vibration of the generated magnetic flux gives a bad influence to the image, no clear image can be obtained.

SUMMARY OF THE INVENTION

The present invention is made in order to solve the above problems. An object of the present invention is to provide a superconducting magnet in which the vibration of the magnetic flux generated by the superconducting magnet is suppressed so as to not give bad influence to an image by reducing the vibration transmitted from the refrigerator to the coil container containing the superconducting coil, and to provide an MRI apparatus using the superconducting magnet.

In order to attain the above object, the present invention is characterized by an MRI apparatus comprising a superconducting magnet in which the coolant tank for supplying the coolant to the coil containers for containing the superconducting coils together with the coolant are provided separately from the coil containers, and the refrigerator is placed in the coolant tank, and the coolant tank and the coil containers are connected to each other by coolant circulation passage; a bed capable of mounting a body to be inspected and moving between the coil containers of the superconducting magnets opposite to each other; and a control unit for analyzing a nuclear magnetic resonance signal from the body to be inspected.

DESCRIPTION OF THE PREFERRED EMBODIMENTS

Embodiments of the present invention will be described below, referring to the accompanied drawings.

Figure 17:
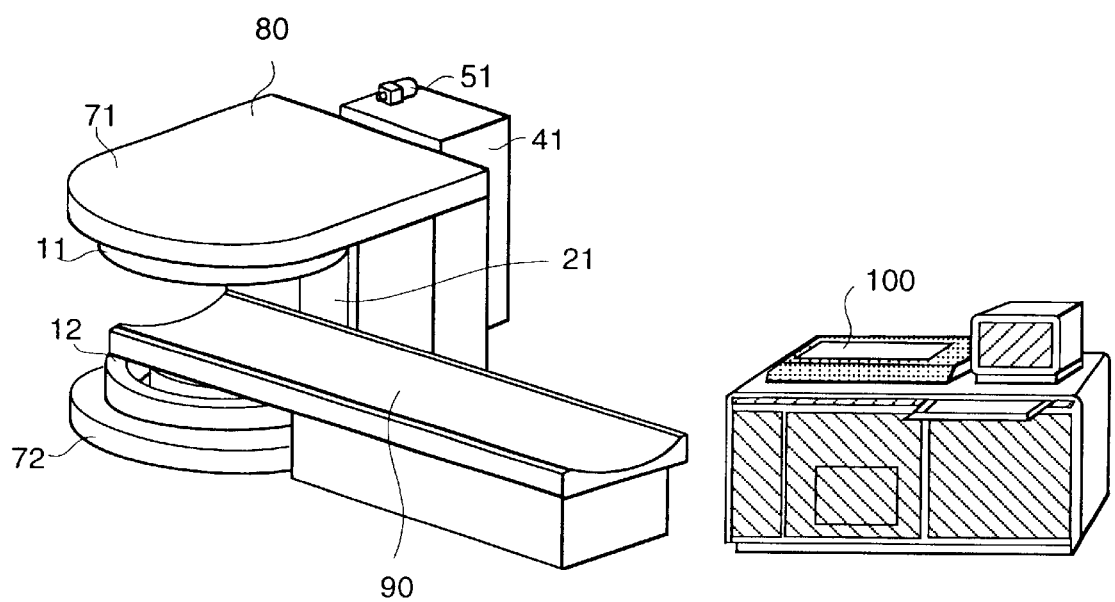
FIG. 17 is a perspective view showing a magnetic resonance imaging apparatus using the superconducting magnet in accordance with the present invention.

Initially, the construction of an MRI apparatus will be briefly described below. As shown in FIG. 17, the MRI apparatus comprises a superconducting magnet which is comprised of superconducting coils, not shown, coil containers 11 and 12 each containing the superconducting coil together with a coolant (for example, liquid helium), a coolant tank 41 for storing the coolant and a refrigerator for cooling the coolant; a bed 90 for mounting a body to be inspected; and a control unit 100 for analyzing a nuclear resonance signal from the body to be analyzed. The coil containers 11 and 12 are arranged separately from and opposite to each other, and a magnetic field space is formed between both of the coil containers 11 and 12, and a tomogram is taken by passing the body to be inspected mounted on the bed 90.

Embodiments of the superconducting magnet employed in the above-described MRI apparatus will be described below.

Figure 1:
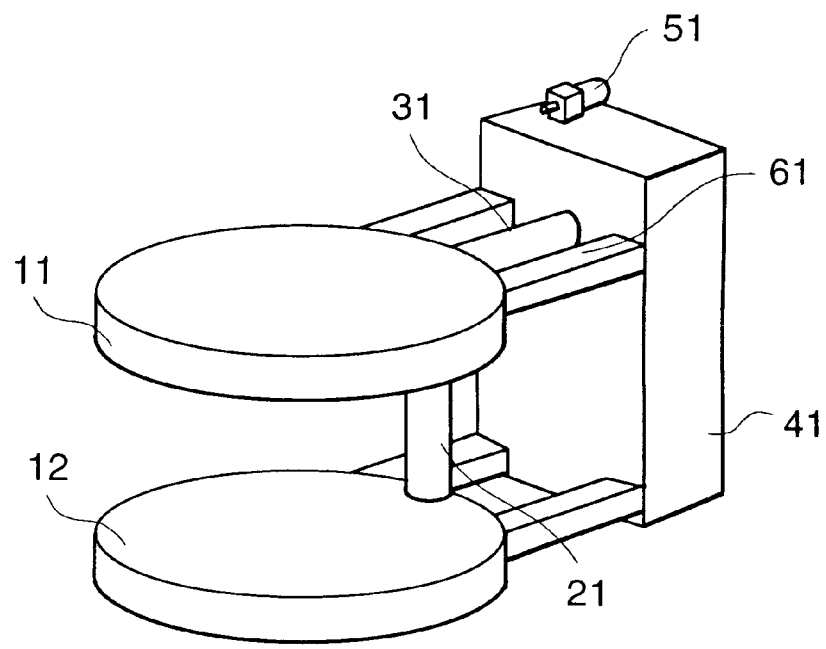
FIG. 1 is a perspective view showing an embodiment of a superconducting magnet in accordance with the present invention.

FIG. 1 shows a first embodiment of a superconducting magnet.

In this embodiment, the coolant tank (hereinafter, referred to as He tank) 41 for supplying the coolant to the coil containers 11 and 12 is provided separately from the coil containers 11 and 12, the refrigerator 51 is arranged in the He tank 41, and a coolant circulation passage 31 (pipe) connects between the He tank 41 and the coil containers 11 and 12. The coil containers 11 and 12 are supported by the He tank 41 through a support member 61.

Further, a connecting passage 21 connects between the upper and the lower coil containers 11 and 12, and liquid He and He gas pass through the inside of the connecting passage 21, and coil connecting wires also pass through. Furthermore, a passage 31 connects between the coil container 11 and the He tank 41 so that the liquid He can supplied from the He tank 41 to the coil container 11 through the passage 31 and the He gas can be returned to the He tank 41. The refrigerator 51 is installed in the He tank 41 as described above, and the role of the refrigerator 51 is to condense the He gas returned to the He tank 41.

According to the construction described above, the vibration of the refrigerator 51 hardly propagates the coil containers 11 and 12 because the coil containers 11 and 12 are placed at a position distant from the He tank through the passage 31. Therefore, the effect of the vibration on the, magnetic uniformity in the magnetic field space formed by the superconducting coils can be reduced. Further, since the He tank 41 is distant from the magnetic field space, an empirical magnetic field can be reduced when the superconductor connecting portion of the permanent current switch is placed inside the He tank 41, and accordingly the load factor can be set to a lower value to reduce the cost and improve the reliability. Of course, it is possible to place the permanent current switch and the superconductor connecting portion inside the connecting pipe or the coil containers 11 and 12 when the empirical magnetic field does not to be considered. In addition, since it is unnecessary to arrange the connecting passage for connecting between the coil containers 11 and 12 between the magnetic poles, the room for the body to be inspected can be secured between the magnetic poles to reduce the oppression feeling of the body to be inspected.

Figure 2:
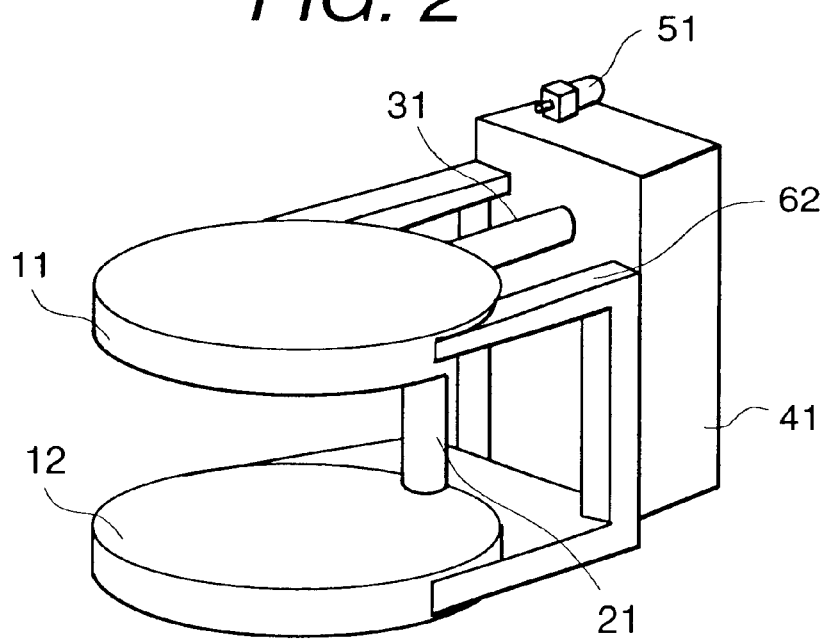
FIG. 2 is a perspective view showing another embodiment of a superconducting magnet in accordance with the present invention.

FIG. 2 shows a second embodiment of a superconducting magnet.

The construction of the present embodiment is that in the first embodiment, the coil container support member 62 for supporting the upper and the lower coil containers 11 and 12 is provided separately from the He tank 41. Although the construction has the same effect as that of the first embodiment, the structure having the coil container support member 62 is more reasonable than that of the embodiment 1 when the He tank 41 can be made compact.

Figure 3:
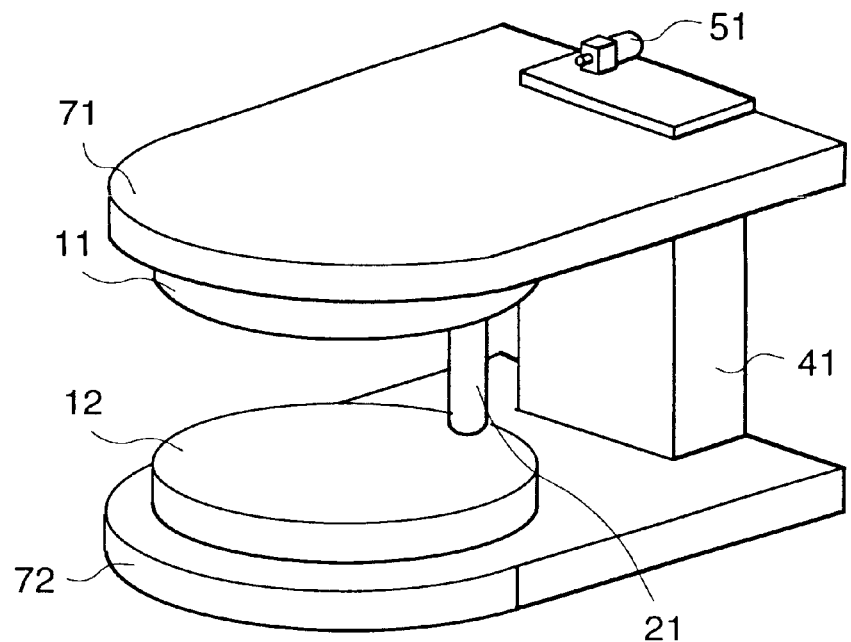
FIG. 3 is a perspective view showing another embodiment of a superconducting magnet in accordance with the present invention.

FIG. 3 shows a third embodiment of a superconducting magnet.

The construction of the present embodiment is that in addition to the construction of the first embodiment, the ferromagnetic members 71 and 72 arc arranged in the outside (in the reverse side of the opposite surfaces) of the coil containers 11 and 12. Although the construction has the same effect as that of the first embodiment, the leakage magnetic field can be reduced by placing the ferromagnetic members 71 and 72 in those positions. In some cases, it is possible to improve the magnetic field shielding performance by arranging active shielding coils on the ferromagnetic members 71 and 72. The coil container 11 is connected to the He tank 41 through a passage, not shown in the figure.

Figure 4:
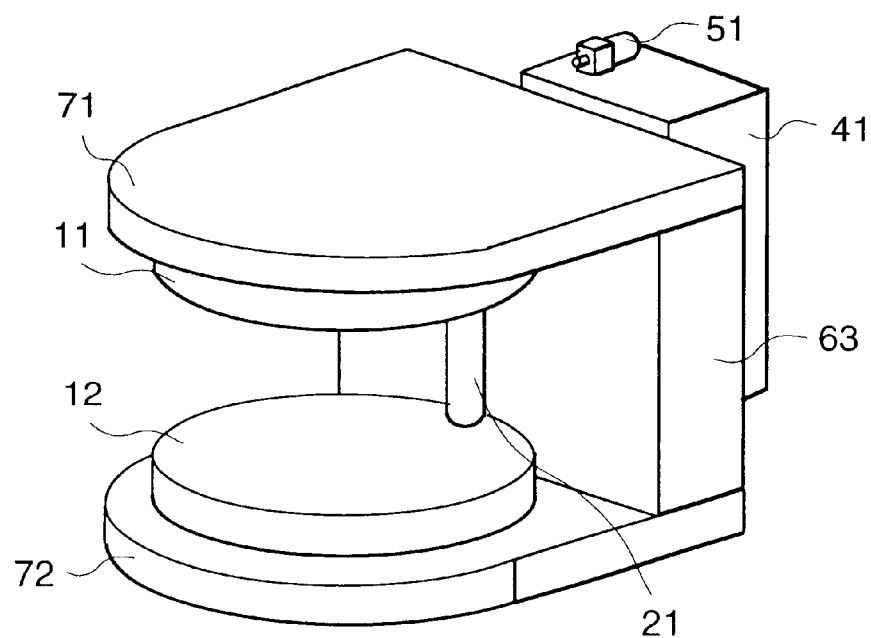
FIG. 4 is a perspective view showing another embodiment of a superconducting magnet in accordance with the present invention.
Figure 5:
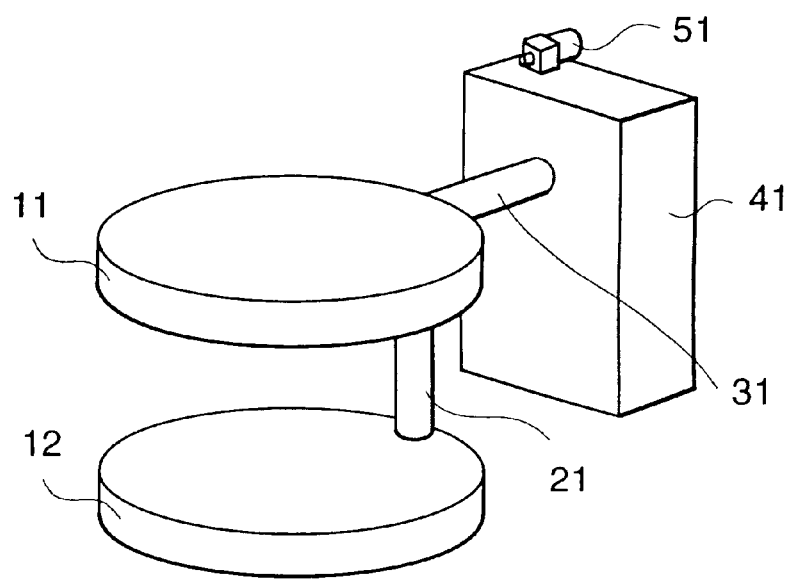
FIG. 5 is a perspective view showing another embodiment of a superconducting magnet in accordance with the present invention.

FIG. 4 and FIG. 5 show a fourth embodiment of superconducting magnet. FIG. 5 shows the state that the magnetic pole support members 71 and 72, the magnetic poles and the support member 63 illustrated in the structure of FIG. 4 are removed.

The construction of the present embodiment is that the coil containers 11 and 12 having the ferromagnetic members 71 and 72 in the outside are supported by another member 63 separated from the He tank 41.

As described in the second embodiment, the structure having another support 63 separately from the He tank 41 is more economical when the He tank 41 can be made compact. Further, when the support 63 is made of a ferromagnetic material (iron), a magnetic circuit is formed together with the upper and the lower ferromagnetic members 71 and 72, and accordingly the leakage magnetic field can be more effectively suppressed.

Figure 6:
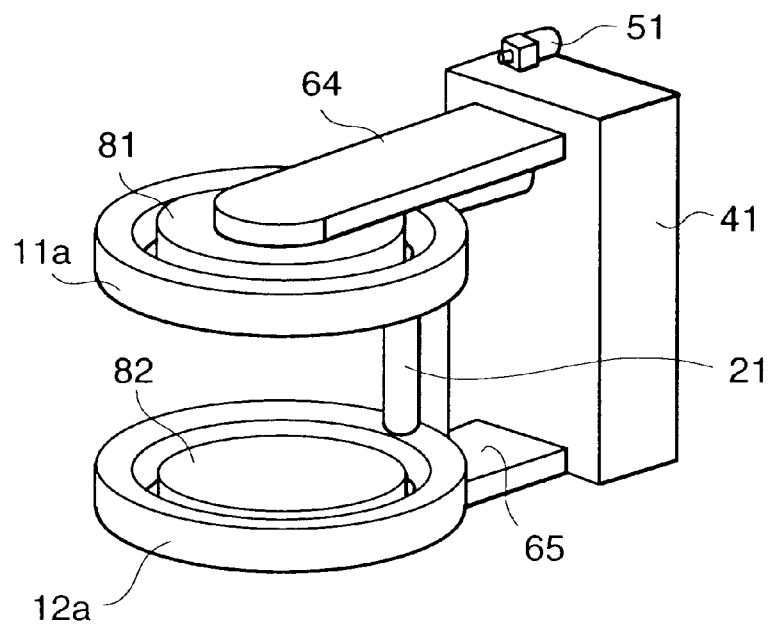
FIG. 6 is a perspective view showing another embodiment of a superconducting magnet in accordance with the present invention.

FIG. 6 shows a fifth embodiment of a superconducting magnet.

The construction of the present embodiment is that annular spatial portions are formed in the coil containers 11a and 12a and then magnetic poles 81 and 82 made of a ferromagnetic material arc placed into the annular spatial portions, respectively, and the He tank 41 is also used for supporting the upper coil portion and the lower coil portion including the magnetic poles 81 and 82. That is, the coil containers 11a and 12a having the magnetic poles 81 and 82 are supported by the He tank 41 through the support members 64 and 65. The support members 64 and 65 are made of a non-magnetic material.

Of course, the same effect as the effect of the embodiment 1 can be also obtained by the construction of the present embodiment. Since the magnetic poles 81 and 82 are provided, the superconducting magnet having the magnetic poles 81 and 82 may be more economically constructed depending on the magnetic field intensity or the magnetic field uniformity.

Figure 7:
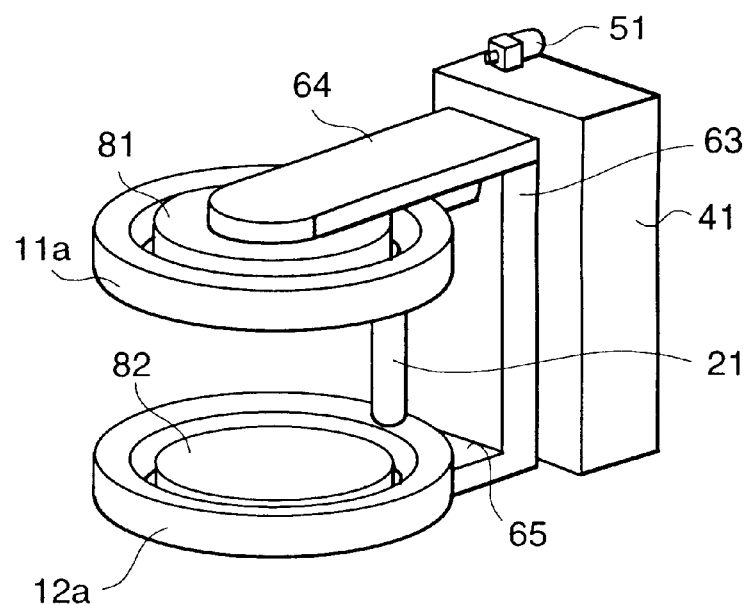
FIG. 7 is a perspective view showing another embodiment of a superconducting magnet in accordance with the present invention.

FIG. 7 shows a sixth embodiment of a superconducting magnet.

The construction of the present embodiment is that another support member 63 is provided separately from the He tank 41, and the coil containers 11a and 12a are supported by the support member 63 integrated with the support members 64 and 65 in a single unit not by the He tank 41. The construction of the present embodiment can also obtain the same effect as the effect of the embodiment 1, and is more economical when the He tank 41 can be made compact.

Figure 8:
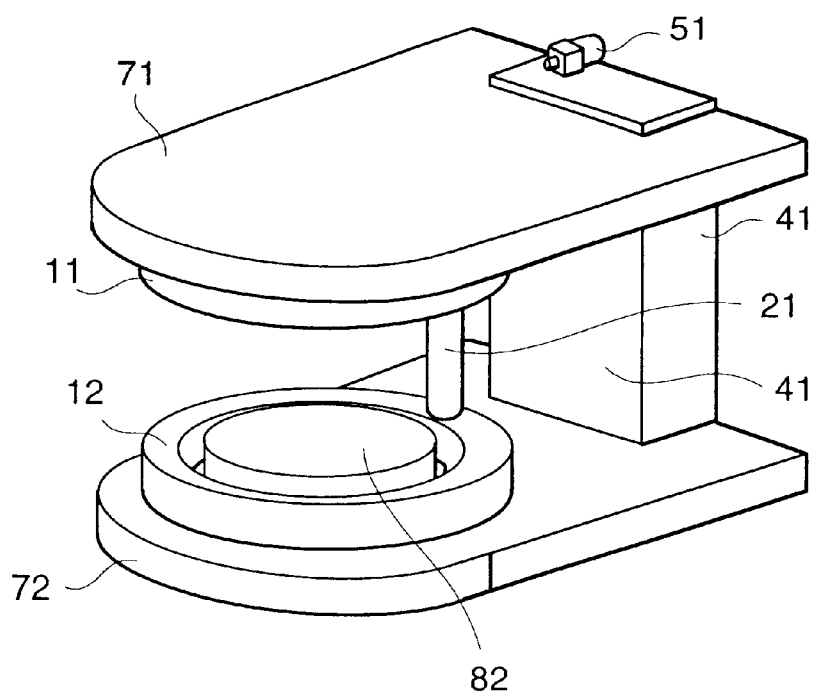
FIG. 8 is a perspective view-showing another embodiment of a superconducting magnet in accordance with the present invention.

FIG. 8 shows a seventh embodiment of a superconducting magnet.

The construction of the present embodiment is that the upper and the lower coil containers 11 and 12 having the individual magnetic poles are covered with the magnetic pole support members 71 and 72 though which the upper and the lower coil containers 11 and 12 are supported by the He tank 41, respectively. The construction of the present embodiment, of course, can obtain the same effect as that of the above-mentioned embodiments, and is effective to reduce the leakage magnetic field. In order to further reduce the leakage magnetic field, it is effective to place magnetic shielding coils in the outer sides of the ferromagnetic members.

Figure 9:
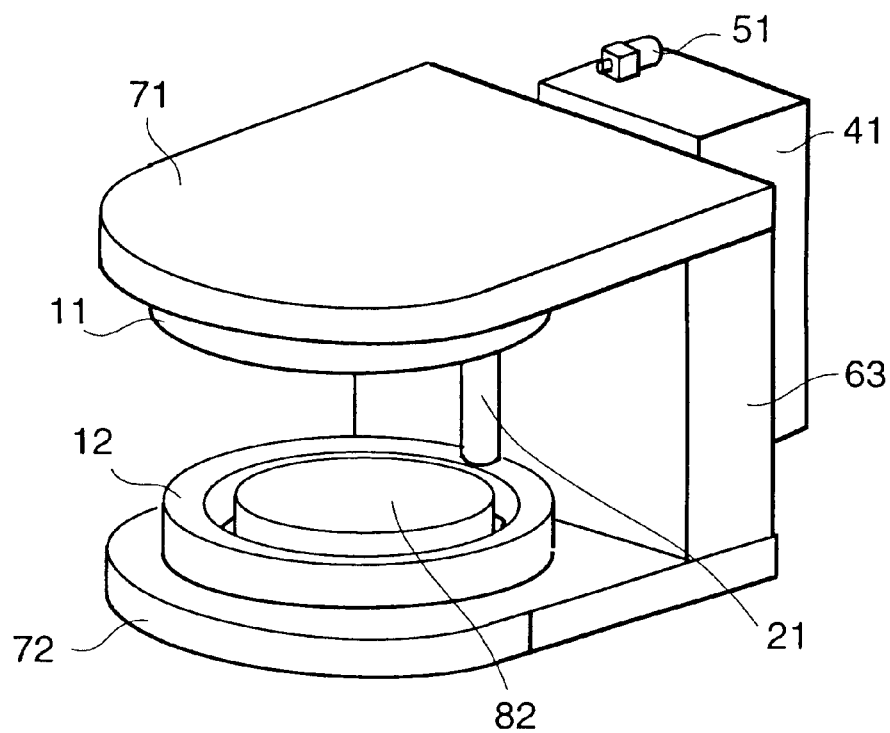
FIG. 9 is a perspective view showing another embodiment of a superconducting magnet in accordance with the present invention.
Figure 10:
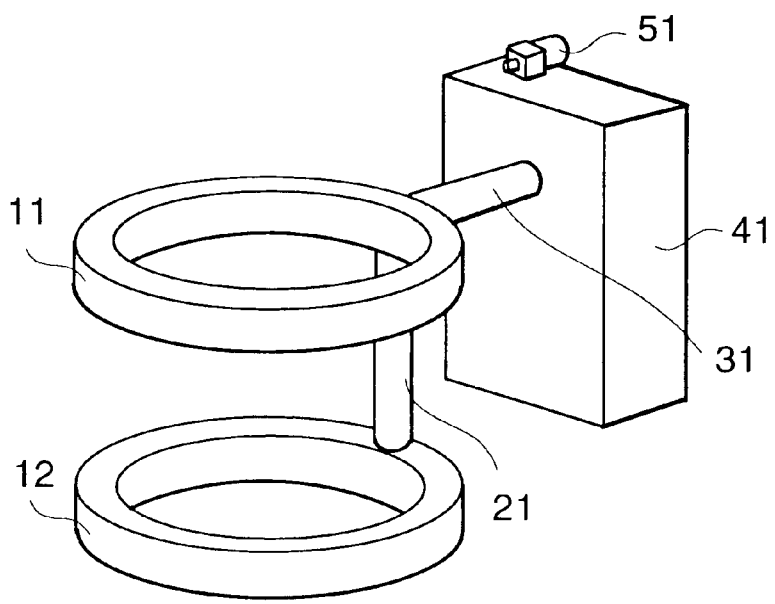
FIG. 10 is a perspective view showing another embodiment of a superconducting magnet in accordance with the present invention.

FIG. 9 and FIG. 10 show an eighth embodiment of superconducting magnet. FIG. 10 shows the state that the magnetic pole support members 71 and 72, the magnetic poles and the support member 63 illustrated in the structure of FIG. 9 are removed.

The construction of the present embodiment is that another support member 63 is provided separately from the He tank 41, and the coil containers 11 and 12 are supported by the support member 63 integrated with the magnetic pole support members 71 and 72 provided so as to cover the coil containers 11 and 12 in a single unit, and further that the magnetic pole support members 71 and 72 are made of a ferromagnetic material, and the support member 63 connecting between the upper and the lower coil containers 11 and 12 are also made of a ferromagnetic material.

The construction of the present embodiment, of course, can obtain the same effect as that of the above-mentioned embodiments, and the magnetic fluxes can be more restrained by combining the magnetic circuit to the magnetic poles 81 and 82 to further reduce the leakage magnetic field.

Figure 11:
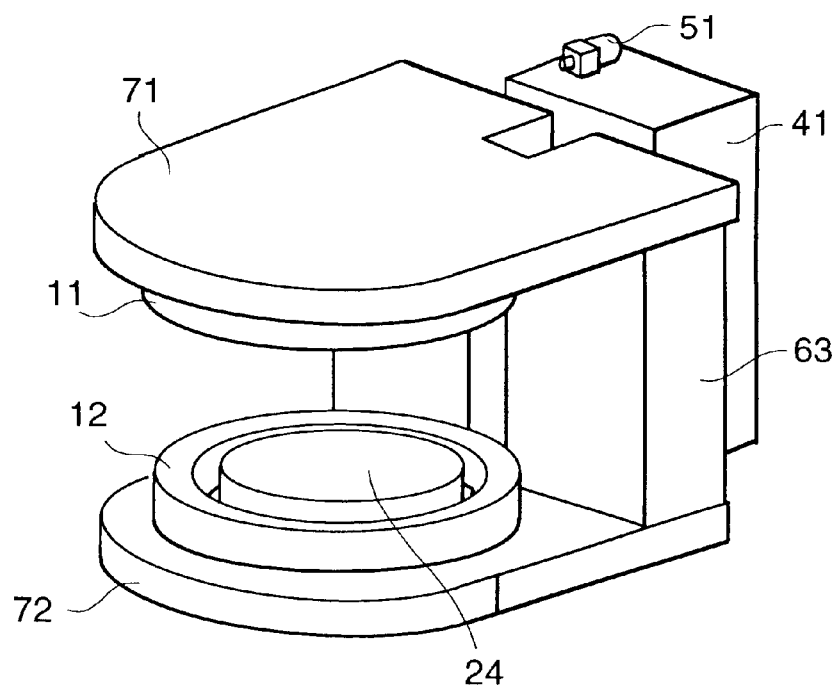
FIG. 11 is a perspective view showing another embodiment of a superconducting magnet in accordance with the present invention.
Figure 12:
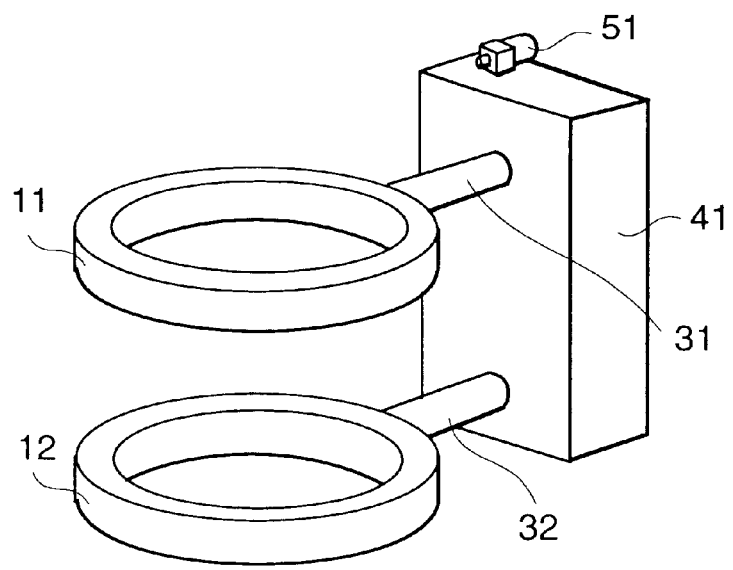
FIG. 12 is a perspective view showing another embodiment of a superconducting magnet in accordance with the present invention.

FIG. 11 and FIG. 12 show an eighth embodiment of superconducting magnet. FIG. 12 shows the state that the magnetic pole support members 71 and 72, the magnetic poles and the support member 63 illustrated in the structure of FIG. 11 are removed.

The construction of the present embodiment is that the connecting passage 21 for connecting between the upper and the lower coil containers 11 and 12 described in the above-described embodiments is eliminated, and passages 31 and 32 directly connect the coil containers 11 and 12 to the He tank 41, respectively. By doing so, of course, the effect of the above-described embodiments can be maintained, and the space for inserting the body to be inspected is widened.

Figure 13:
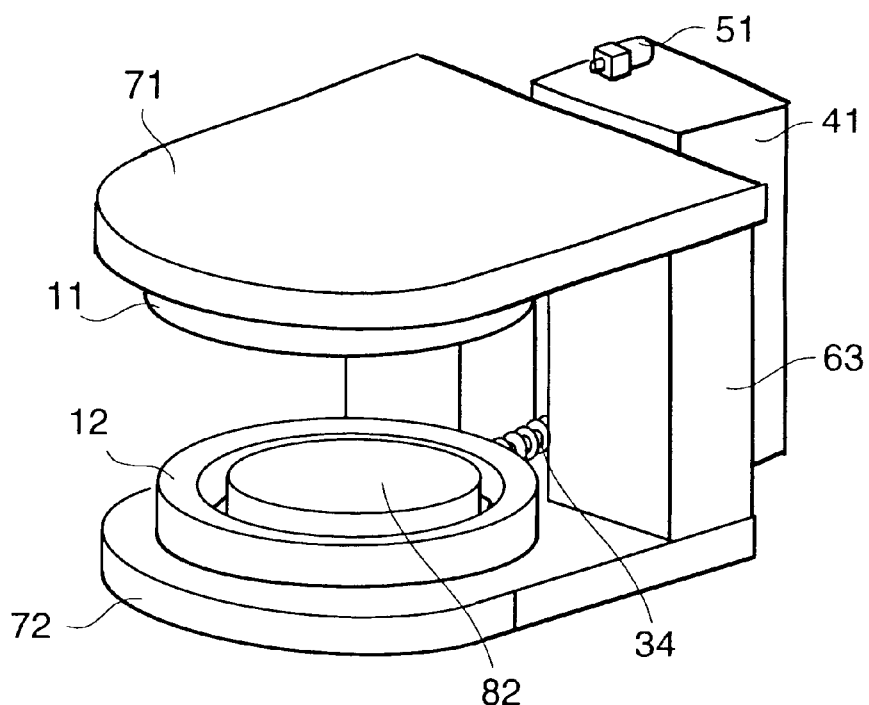
FIG. 13 is a perspective view showing another embodiment of a superconducting magnet in accordance with the present invention.
Figure 14:
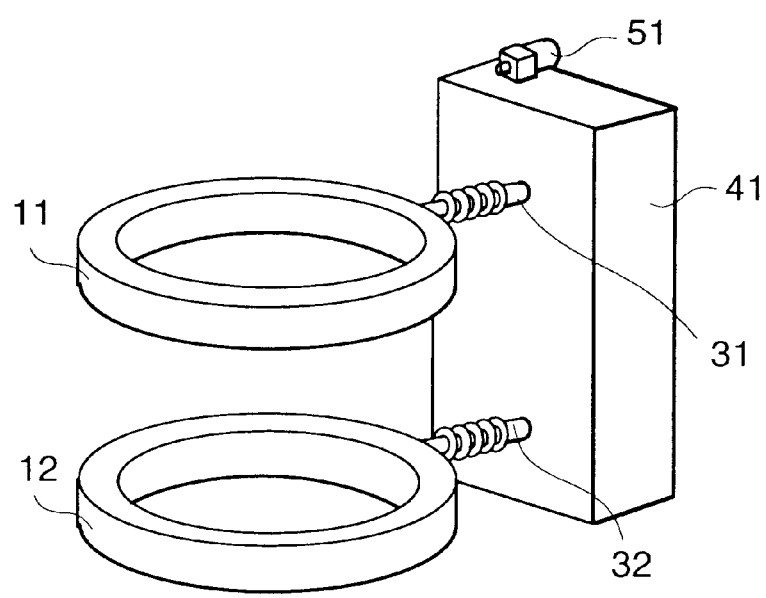
FIG. 14 is a perspective view showing another embodiment of a superconducting magnet in accordance with the present invention.

FIG. 13 and FIG. 14 show an eighth embodiment of superconducting magnet. FIG. 14 shows the state that the magnetic pole support members 71 and 72, the magnetic poles and the support member 63 illustrated in the structure of FIG. 13 are removed.

The construction of the present embodiment is that a vibration isolating means 33 and 34 are provided in intermediate portions of the passages 31 and 32 for connecting the coil containers 11 and 12 to the He tank 41 described in the above-described embodiments, respectively. The superconducting magnet of the present invention is essentially constructed so as to hardly receive the vibration of the refrigerator because the passage is provided between the coil containers 11, 12 and the coolant tank 41 in which the refrigerator is placed. However, by providing the vibration isolating means described above in the passages 31 and 32, the isolation of vibration can be further secured.

By the vibration isolating means, it is possible to effectively suppress the vibration of the refrigerator to transmit to the coil containers.

Figure 15:
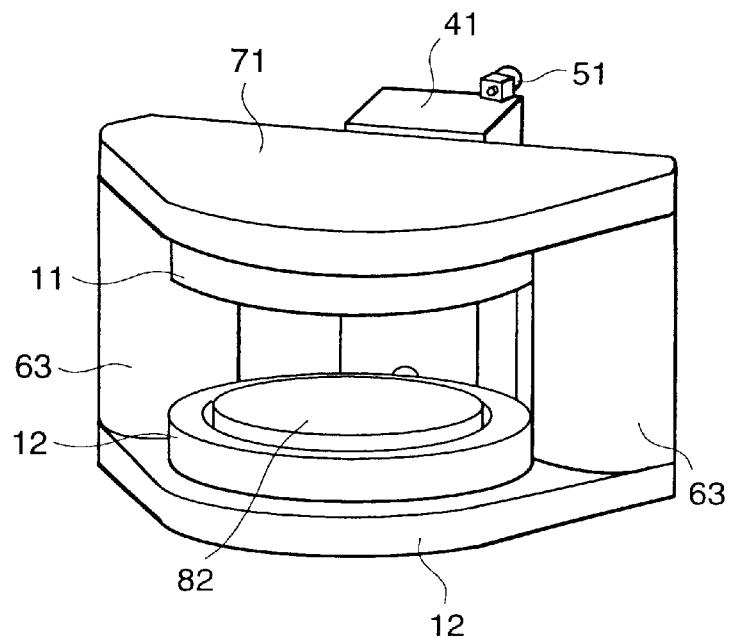
FIG. 15 is a perspective view showing another embodiment of a superconducting magnet in accordance with the present invention.

The construction of the embodiment shown in FIG. 15 is that there are provided a plurality of upper-and-lower coil portion supports 63 (two supports, in the present embodiment).

Figure 16:
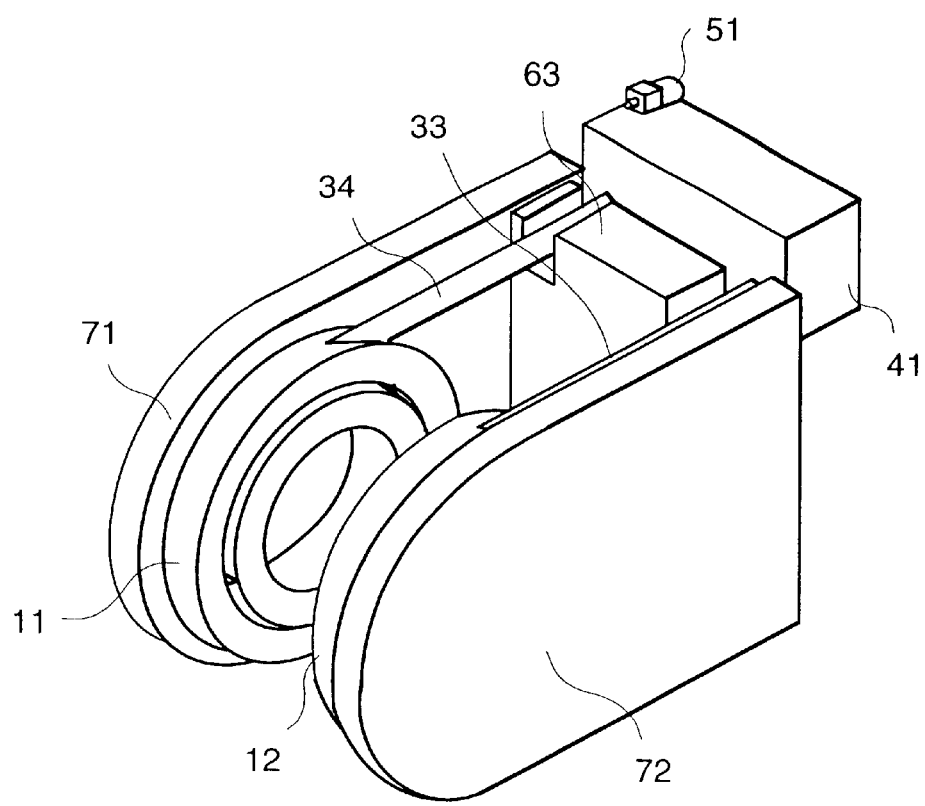
FIG. 16 is a perspective view showing another embodiment of a superconducting magnet in accordance with the present invention.

The construction of the embodiment shown in FIG. 16 is that the magnets are horizontally arranged so that the coil containers 11 and 12 are horizontally opposite to each other. In the present embodiment, it is possible to construct an apparatus in which the body to be inspected can be inspected while keeping standing.

As having described above, according to the present invention, the coil containers are distant from the coolant tank, and the distance between the refrigerator contained in the coolant tank and the superconducting coils can be secured, and accordingly the effect of the vibration of the refrigerator on the superconducting coils can be suppressed. Therefore, there is the effect that disturbance of the image can be prevented.

What is claimed is:

1. A superconducting magnet comprising superconducting coils; coil containers, each of said coil container containing a superconducting coil together with coolant; and a refrigerator for cooling said coolant, said coil containers being arranged separately from and opposite to each other, a magnetic field space being formed between both of said coil containers, wherein
a coolant tank for supplying the coolant to said coil containers is provided separately from said coil containers, and said refrigerator is placed in said coolant tank, and a coolant circulation passage connects between said coolant tank and said coil containers.

2. A superconducting magnet according to claim 1, wherein a ferromagnetic member is arranged on a surface in a reverse side of an opposite surface of each of said coil containers.

3. A superconducting magnet according to claim 1, wherein each of said coil containers is supported by said coolant tank through a support member.

4. A superconducting magnet according to claim 1, wherein each of said coil containers is supported by said coolant tank through a support unit.

5. A superconducting magnet according to claim 1, wherein a connecting passage connects between said coil containers each other, and lead wires connecting said superconducting coils in said coil containers to each other pass through the inside of said connecting passage.

6. A superconducting magnet according to claim 5, wherein number of said connecting passages is plural.

7. A superconducting magnet according to claim 1, wherein a support member for supporting a ferromagnetic body is provided separately from said coolant tank, said ferromagnetic body being arranged on a surface in a reverse side of an opposite surface of each of said coil containers, said coil container being supported by said support member through said ferromagnetic body.

8. A superconducting magnet according to claim 1, wherein a flexible portion is provided in an intermediate portion of said coolant circulation passage.

9. A superconducting magnet according to claim 1, wherein said coil containers opposite to each other are arranged vertically or horizontally opposite to each other.

10. A magnetic resonance imaging apparatus comprising the superconducting magnets described in claim 1; a bed capable of mounting a body to be inspected and moving between said coil containers of said superconducting magnets opposite to each other; and a control unit for analyzing a nuclear magnetic resonance signal from the body to be inspected.

11. A superconducting magnet comprising superconducting coils; coil containers, each of said coil container containing a superconducting coil together with coolant; and a refrigerator for cooling said coolant, said coil containers being arranged separately from and opposite to each other, a magnetic field space being formed between both of said coil containers, wherein an annular spatial portion is formed in one surface of said coil container, a ferromagnetic magnetic pole being arranged in the annular spatial portion, a coolant tank for supplying a coolant to said coil container being provided separately from said coil container, said refrigerator being placed in said coolant tank, a coolant circulation passage connecting between said coolant tank and said coil container.

12. A superconducting magnet according to claim 11, wherein each of said coil containers including said magnetic pole is supported by said coolant tank through a non-magnetic support member.

13. A superconducting magnet according to claim 11, wherein a support member for supporting said coil container is provided separately from said coolant tank, and each of said coil containers including said magnetic pole is supported by said support member through non-magnetic support member.

14. A superconducting magnet according to claim 11, wherein each of said coil containers including said magnetic pole is supported by said coolant tank through a ferromagnetic support member.

15. A superconducting magnet according to claim 11, wherein a support member for supporting said coil container is provided separately from said coolant tank, and each of said coil containers including said magnetic pole is supported by said support member through ferromagnetic support member.

* * * * *